US005990779A

United States Patent [19]

Katsuki et al.

[11] Patent Number: 5,990,779

[45] Date of Patent: *Nov. 23, 1999

[54] ELECTRONIC APPARATUS AND SURFACE MOUNTING DEVICES THEREFOR

[75] Inventors: Takayo Katsuki; Yuichi Takaoka; Kiyofumi Torii; Akira Toba; Osamu Watanabe; Kouichi Tatsuoka; Masaru Nakagawa; Masahiro Yokota; Shinji Omura; Hiroshi Ohta, all of Shiga, Japan

[73] Assignee: Murata Manufacturing Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,866

[22] Filed: Apr. 8, 1997

Related U.S. Application Data

[63] Continuation of application No. 08/502,507, Jul. 14, 1995, abandoned.

[30] Foreign Application Priority Data

| | | | |
|---|---|---|---|
| Jul. 18, 1994 | [JP] | Japan | 6-165522 |
| Oct. 3, 1994 | [JP] | Japan | 6-239141 |

[51] Int. Cl.[6] .......... H01L 1/022

[52] U.S. Cl. .......... 338/232; 338/232; 338/234; 338/22 R; 338/221; 361/813; 174/52.6

[58] Field of Search .......... 338/22 R, 225 D, 338/312, 313, 232, 233, 234, 324, 322, 332, 221, 220, 230; 361/811, 813, 820, 306.1, 308.1; 174/52.5, 52.6

[56] References Cited

U.S. PATENT DOCUMENTS

| | | | |
|---|---|---|---|
| Re. 31,367 | 8/1983 | D'Entremont | 361/27 |
| 1,782,045 | 9/1930 | Dublier | 338/220 |
| 3,721,867 | 3/1973 | Schierz | 174/52.6 |
| 4,099,154 | 7/1978 | Bar | 338/220 |
| 4,267,635 | 5/1981 | Blaha | 29/622 |
| 4,282,003 | 8/1981 | Yashin et al. | 29/619 |
| 4,318,073 | 3/1982 | Rossler, Jr. et al. | 338/28 |
| 4,689,614 | 8/1987 | Welch et al. | 338/22 R |
| 4,894,637 | 1/1990 | Yamada et al. | 338/22 R |
| 4,959,505 | 9/1990 | Ott . | |
| 5,420,745 | 5/1995 | Hidaka et al. | 361/306.1 |

FOREIGN PATENT DOCUMENTS

| | | |
|---|---|---|
| 3638342 | 11/1986 | Germany . |
| 2146488 | 9/1984 | United Kingdom . |

*Primary Examiner*—Michael L. Gellner
*Assistant Examiner*—Karl Easthom
*Attorney, Agent, or Firm*—Majestic, Parsons, Siebert & Hsue P.C.

[57] ABSTRACT

A thermistor for surface mounting includes a first conductive terminal member, a case having a top opening, a planar thermistor element having electrodes on mutually opposite main surfaces thereof, and a second conductive terminal member having at one end thereof a planar cover part which is attached to the top part of the case. One end of the first terminal member is positioned inside the case and above its bottom member. The other ends of the first and second terminal members are positioned on the bottom surface of the case.

6 Claims, 6 Drawing Sheets

ELECTRONIC APPARATUS AND SURFACE MOUNTING DEVICES THEREFOR

This is a continuation of application Ser. No. 08/502,507 filed Jul. 14, 1995, now abandoned.

BACKGROUND OF THE INVENTION

This invention relates to electronic apparatus for surface-mounting and surface mounting devices for such apparatus. More particularly, this invention relates, on one hand, to electronic apparatus adapted for surface mounting such as thermistors for controlling a current and, on the other hand, to surface mounting devices for such an electronic apparatus having a pair of electrodes on its upper and lower surfaces.

Consider, for example, a positive temperature coefficient (PTC) thermistor element as shown at 101 in FIG. 12, as an example of a planar ceramic electronic element having a pair of ohmic electrodes 101*a* and 101*b* on its lower and upper surfaces. The PTC element may be a disk with thickness 3 mm and diameter 6 –10 mm. A prior art method of mounting such an element to a printed circuit board was to provide connector electrodes (say, of silver) on the ohmic electrodes 101*a* and 101*b*, to attach lead lines to these connector electrodes and to attach the element to the circuit board through these lead lines. For providing compact apparatus, however, such elements are now mounted directly to the circuit board.

For this purpose, a printed circuit board 104 as shown in FIG. 12 with contact electrodes 104*a* and 104*b* may be provided, cream solder 103 may be applied over the circuit board electrode 104*a* before the element 101 is placed thereon, and its ohmic electrode 101*a* on the lower surface is connected to the contact electrode 104*a* by reflow soldering. Next, one end of an electro-conductive lead line 105 is soldered to the other electrode 101*b* on the upper surface of the element 101, the other end of the lead line 105 being soldered to the other contact electrode 104*b*. In FIG. 12, numeral 106 indicates the solder used for the attachment of the lead line 105.

Surface-mounted prior art elements of this kind have many problems. Firstly, two kinds of soldering are required for the mounting, the reflow soldering by which the element 101 is connected to the circuit board 104 and the soldering of the lead line 105 to the circuit board 104 and to the element 101. This makes the mounting a time-consuming process. Secondly, since it is not practically possible to simultaneously carry out the soldering of both electrodes 101*a* and 101*b* on the two principal surfaces of the element 101, the heat from the first soldering of the lower-surface electrode 101*a* affects adversely the soldering of the upper-surface electrode 101*b*. The situation would not change if the order of soldering were reversed, because the soldering characteristics of the electrode to be soldered later are adversely affected. Thirdly, since the ceramic element 101, which is sensitive to heat, is heated twice, micro-cracks are likely to be generated due to the thermal stress. Fourthly, since the element 101 generates heat when it is operated, the generated heat is directly transmitted to the circuit board 104 and through the circuit board 104 to other electronic elements which may be mounted thereon, adversely affecting their performance.

SUMMARY OF THE INVENTION

It is therefore an object of this invention to provide electronic apparatus, such as thermistors, adapted for surface mounting, with which the problems described above can be eliminated.

It is another object of this invention to provide a thermistor adapted for surface mounting, having a heat-emitting thermistor element contained inside a casing.

It is a further object of this invention to provide a surface mounting device which makes the surface mounting easier for an electronic apparatus made of a ceramic material, and is capable of lowering the temperature where the apparatus is mounted.

A thermistor for surface mounting embodying this invention, with which the above and other objects can be achieved, may be characterized as comprising a first conductive terminal member, a case having a top opening, a planar thermistor element having electrodes on mutually opposite main surfaces thereof, and a second conductive terminal member having at one end thereof a planar cover part which is attached to the top part of the case. One end of the first terminal member is positioned inside the case and above its bottom member of the case. The other ends of the first and second terminal members are positioned on the bottom surface of the case.

The first terminal member may have a contact point part at a position elevated from the bottom member of the case, holding the thermistor element thereon. The first and second terminal members may be bent to have their lower ends positioned on the lower surface of the bottom member of the case. The top part of the case may be formed with an inner top edge part and an outer top edge part, the inner top edge part being inside and lower than the outer top edge part, edge portions of the planar cover part being placed on the inner top edge part and the outer top edge part being bent over the edge portions of the planar cover to secure it to the case. Alternatively, the top edge part of the case may be provided with upward protrusions thereon, the planar cover part having throughholes formed therethrough correspondingly to these protrusions such that the protrusions can be inserted into the throughholes and the planar cover part can thus be secured to the case.

The first terminal member may comprise a flexible material bent by 180 degrees, having a contact point part at one end thereof contacting the thermistor element.

A surface mounting device, embodying the invention for an electronic element having an upper-surface electrode and a lower-surface electrodes formed on upper and lower main surfaces thereof, may be further characterized as comprising an electrically insulative case having an internal space for containing the element therein, a first electrically conductive member which is in part buried in this insulative case, and a second electrically conductive member. The first conductive member includes a first compression contact part for being pressed against the lower-surface electrode of the electronic element on the bottom member of the case and a first connector part on the bottom surface of the case. The second conductive member includes a second compression contact part attached to an upper part of the case for being pressed against the upper-surface electrode of the electronic element and a second connector part which extends on a side surface of the case and reaches the bottom surface of the case. The first compression contact part may be provided with one or more protrusions for pressing the lower-surface electrode. The case may be provided with engaging mechanisms on its mutually opposite side surfaces, and the second conductive member with a planar part for covering the case from above and vertically extending parts which cover its side walls and engage with these engaging mechanism so as to be securely attached to the case. The second conductive member may comprise a flexible material, the second compression contact part being bent substantially by 180 degrees from the planar part. The case may further comprise means for preventing motion of the planar part with respect to itself.

BRIEF DESCRIPTION OF THE DRAWINGS

The accompanying drawings, which are incorporated in and form a part of this specification, illustrate embodiments of the invention and, together with the description, serve to explain the principles of the invention. In the drawings.

DETAILED DESCRIPTION OF THE INVENTION

Figure 1:
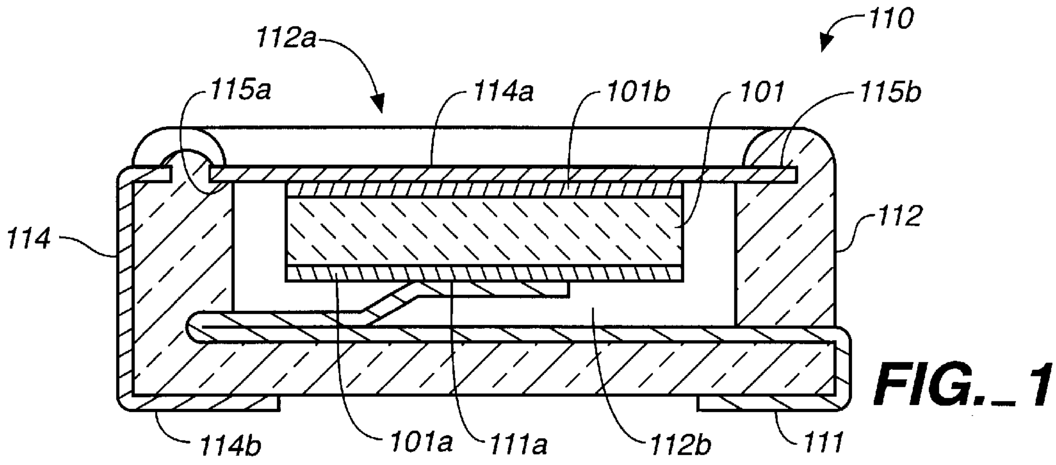
FIG. 1 is a sectional side view of a thermistor for surface mounting embodying this invention.
Figure 2:
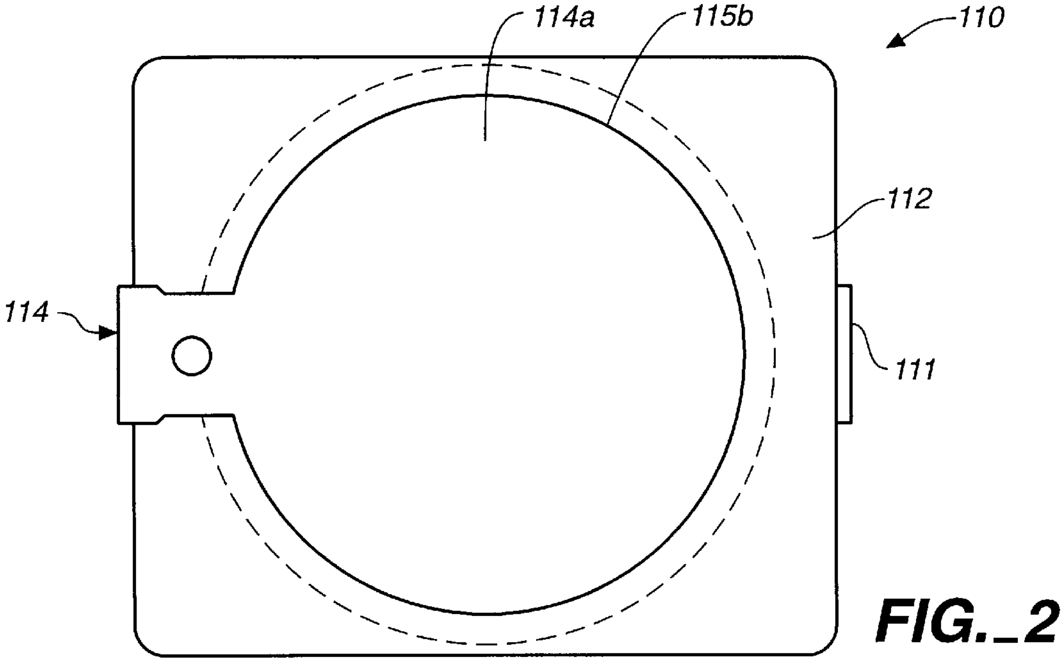
FIG. 2 is a plan view of the thermistor of FIG. 1.
Figure 12:
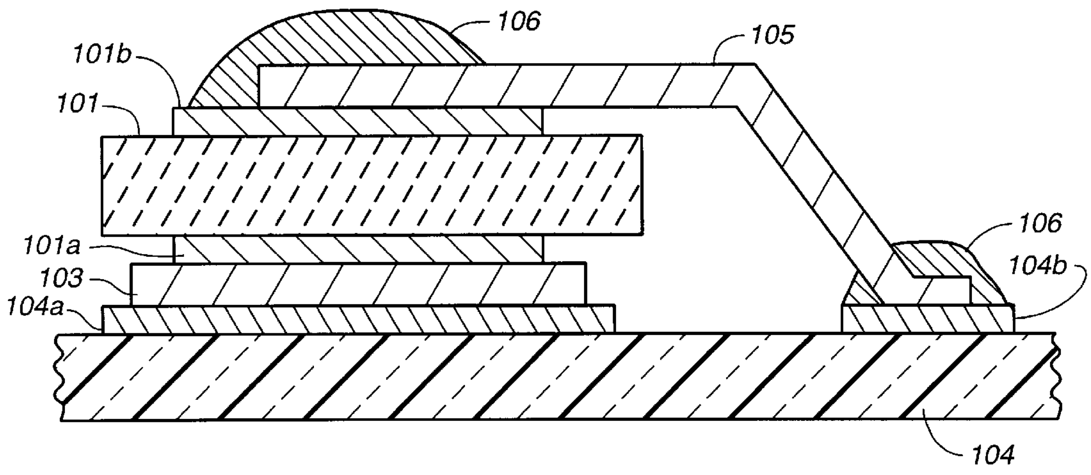
FIG. 12 (PRIOR ART)
FIG. 12 is a partially sectional side view of a prior art thermistor for surface mounting.

FIGS. 1 and 2 show a thermistor 110 according to a first embodiment of this invention adapted for surface mounting, comprising a thermistor element (indicated again by numeral 101, being essentially identical to the element shown in FIG. 12 and described above), a case 112 with a first conductive terminal member 111, and a second conductive terminal member 114. The element 101 is planar, having a pair of electrodes 101*a* and 101*b* on its lower and upper surfaces. It may be a PTC thermistor element for current control, a negative temperature coefficient (NTC) thermistor element or a thermistor element which changes its resistance suddenly such as a critical temperature resistor (CTR). The case 112 is of a box-like shape having a bottom member and an opening 112*a* at the top. The first terminal member 111 extends outward from inside to outside of the case 112. Preferably, the first terminal member 111 has a contact end part 111*a*, which is elastic, is elevated from the upper surface of the bottom member of the case 112, and is bent by 180 degrees to reach the bottom surface of the case 112 by passing on a side surface of the box-like case 112. The edge part of the box-shaped case 112 surrounding its opening 112*a* at the top has an inner top edge part 115*a* and an outer top edge part 115*b*. The outer wall part 115*b* is somewhat higher than the inner top edge part 115*a*.

The second conductive terminal member 114 includes a planar cover part 114*a*, which is dimensioned so as to cover the openings 112*a* by contacting the inner top edge part 115*a* of the case 112, and a flat contact part 114*b*. The thermistor 110 is formed by inserting the thermistor element 101 inside the case 112, closing the opening 112*a* by causing the planar cover part 114*a* to contact the inner top edge part 115*a* of the case 112 from above, deforming the outer top edge part 115*b* inward to thereby fasten the planar cover part 114*a* to the case 112. The contact part 114*b* of the other terminal 114 is guided to the bottom surface of the case 112 through an outer side surface portion of the case 112.

With the thermistor 110 thus formed with its thermistor element 101 mounted inside the case 112, the two electrodes 101*a* and 101*b* of this thermistor element 101 are elastically contacted with the contact end part 111*a* of the first terminal member 111 and the planar cover part 114*a* of the second terminal member 114, respectively, without being soldered to them, with the contact parts of the two terminal members 111 and 114 disposed at opposite ends on the bottom surface of the case 112. Thus, the thermistor 110 can be mounted to a printed circuit board (not shown) covered with a cream solder, for example, by heating the contact parts on its bottom surface only once in a single soldering step. As shown in FIG. 1, there is a space 112*b* created between the bottom member of the case 112 and the thermistor element 101 because the contact end part 111*a* of the first terminal member 111 is elevated from the bottom member of the case 112.

Figure 3:
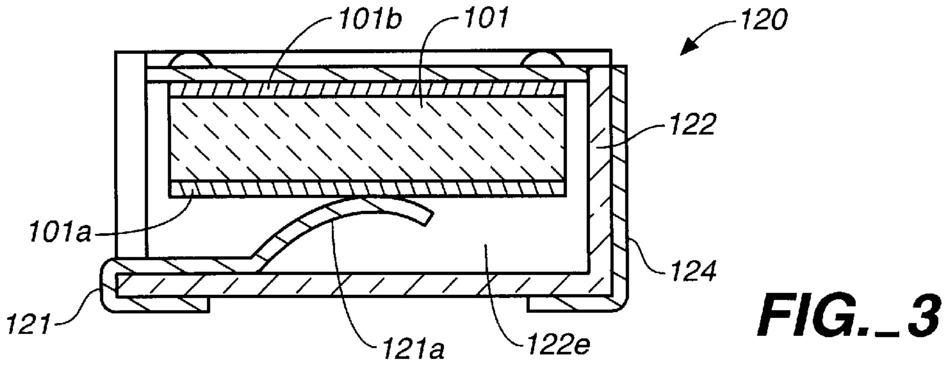
FIG. 3 is a sectional side view of another thermistor for surface mounting embodying this invention.
Figure 4:
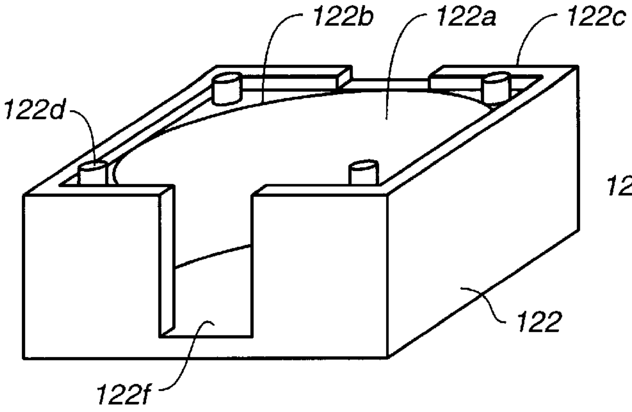
FIG. 4 is a diagonal view of the case shown in FIG. 3.
Figure 5:
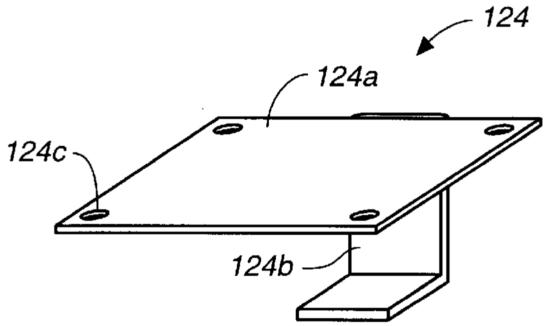
FIG. 5 is a diagonal view of the second terminal shown in FIG. 3.

FIGS. 3–5 show another thermistor 120 embodying this invention, comprising two conductive terminal members (the first 121 and the second 124) and a case 122, in addition to a thermistor element 101 as described above. The first terminal member 121 is made of an elastic material, having an arcuate contact part 121*a* at one end and being sectionally U-shaped at the other end. The case 122 is made of an electrically insulating material in a box-like shape with an opening 122*a* at the top, having therein a space for containing the thermistor element 101. One of the side walls of the boxshaped case 122 has a vertical slit 122*f* extending down to the bottom so as to be able to accept a downwardly extended portion of the first terminal member 121 therein. The top edge part of the box-shaped case 122 surrounding its top opening 122*a* has an inner top edge part 122*b* and an outer top edge part 122*c* which is somewhat higher than the inner top edge part 122*b*. A plurality (four in FIG. 4) of upward protrusions 122*d* are provided on top of the inner top edge part 122*b*.

The second terminal 124 comprises a planar cover part 124*a* at one end and a flat contact part 124*b* at the opposite end, as shown in FIG. 5. The cover part 124*a* is provided with throughholes 124*c* corresponding to the aforementioned protrusions 122*d* for allowing these protrusions 122*d* to be inserted thereinto.

As shown in FIG. 3, the first terminal member 121 is attached to the case 122 with its arcuate contact part 121*a* placed above the upper surface of the bottom member of the case 122, and having its U-shaped end part engaging with the bottom member of the case 122. To form the thermistor 120, the thermistor element 101 is inserted into the case 122, the planar cover part 124*a* of the second terminal member 124 is contacted from above with the inner top edge part 122*b*, and the outer top edge part 122*c* of the case 122 is deformed inwardly, after these protrusions 122*d* are inserted into the throughholes 124*c*, to secure the cover part 124*a* of the second terminal member 124 at the opening 122*a* of the case 122. The flat contact part 124*b* of the second terminal member 124 is led to the bottom surface of the case 122 opposite from the U-shaped end part of the first terminal member 121.

With the thermistor 120 thus formed with its thermistor element 101 mounted inside the case 122, the two electrodes

101*a* and 101*b* of this thermistor element 101 are elastically contacted with the arcuate contact part 121*a* of the first terminal member 121 and the cover part 124*a* of the second terminal member 124, respectively. No solder is required for this purpose, and contact end parts of the two terminal members 121 and 124 are both on the bottom surface of the case 122. Thus, the thermistor 120 can be mounted to a printed circuit board (not shown) covered with a cream solder, for example, by heating the contact end parts of the terminal members on its bottom surface only once in a single soldering step. As shown in FIG. 3, there is a space 122*e* created between the upper surface of the bottom member of the case 122 and the thermistor element 101 because the arcuate contact part 121*a* of the first terminal member 121 is elevated from the bottom member of the case 122.

Alternatively, the protrusions 122*d* of the case 122 may be deformed after being inserted into the throughholes 124*c* of the second terminal member 124, thereby fastening the cover part 124*a* of the second terminal member 124 to the case 122. In this case, the outer top part 122*c* is unnecessary.

Thermistors for surface mounting according to this invention, as described above by way of examples, can be soldered to a printed circuit board by a single step of reflow soldering because their contact parts for external connection are both on the bottom surface of the case. Since the thermistor element is not directly soldered, heat is not applied to the electrodes of the element. The thermistor element is subjected to a thermal stress only once by the soldering. Since the heat of soldering is communicated to the element only indirectly through an empty space, the rise in the temperature of the element is much reduced, and no cracks are generated thereby. The heat generated by the thermistor element itself, when the thermistor is actually in use, is conducted out to the circuit board through the case. Thus, there are no ill-effects on the circuit board or other electronic elements placed near by.

Figure 6:
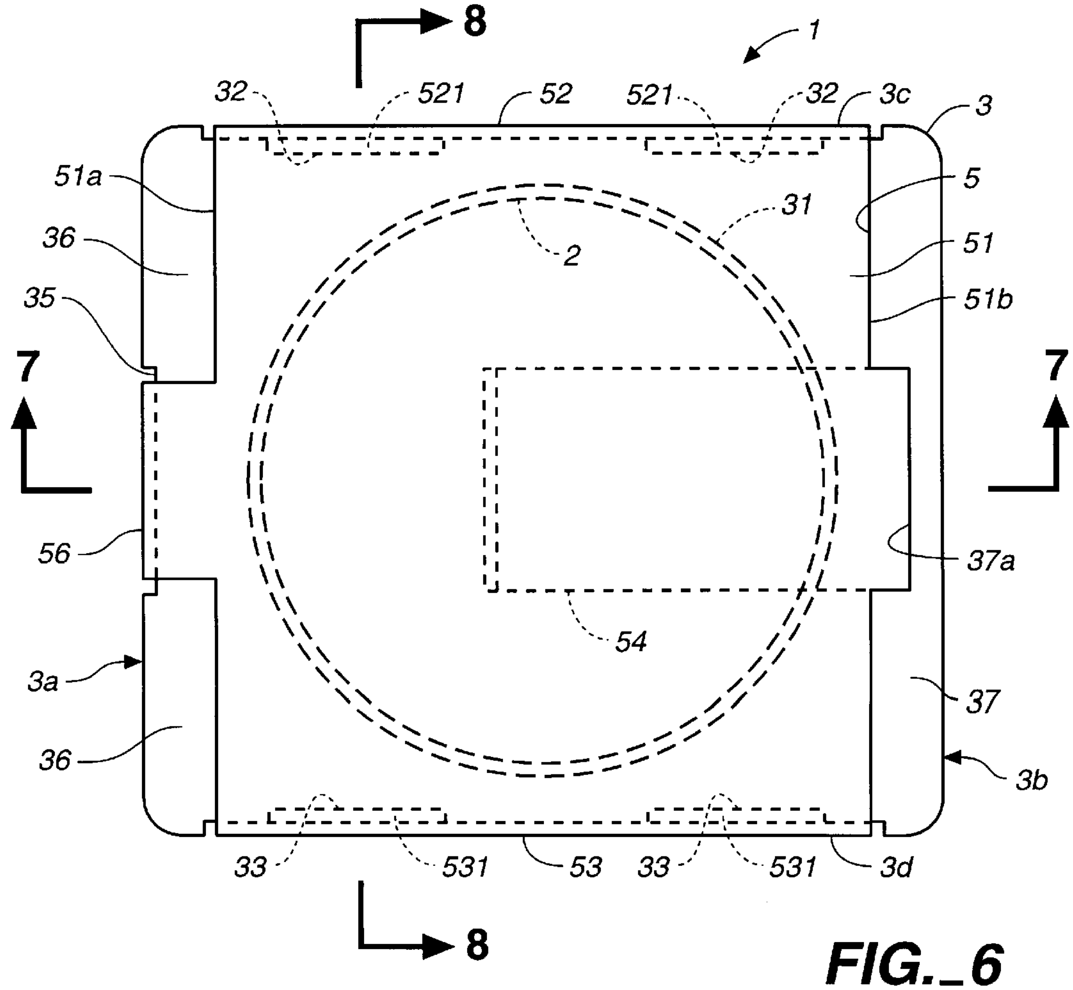
FIG. 6 is a plan view of another electronic apparatus comprising a ceramic material and provided with a surface mounting device embodying this invention.
Figure 7:
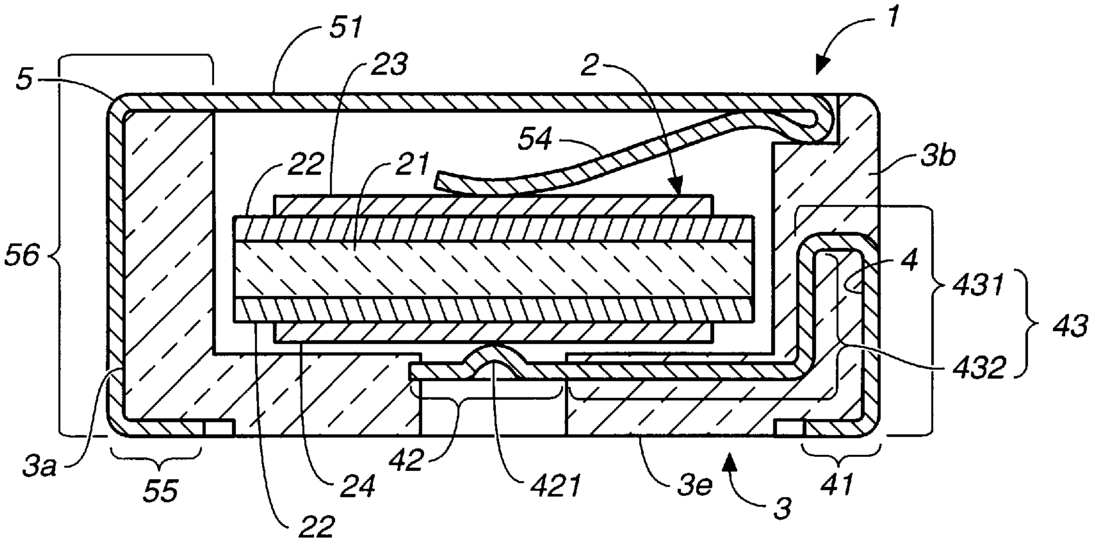
FIG. 7 is a sectional view of the apparatus of FIG. 6, taken along line 7—7 of FIG. 6.
Figure 8:
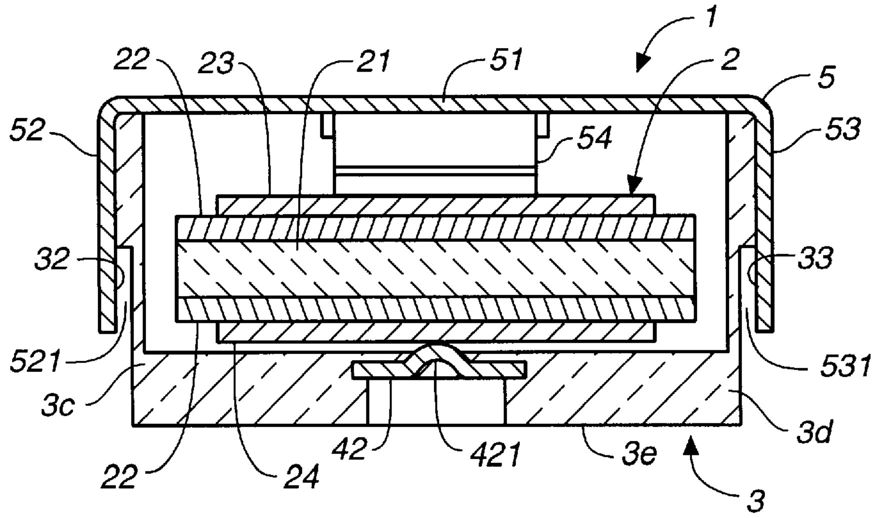
FIG. 8 is a sectional view of the apparatus of FIG. 6, taken along line 8—8 of FIG. 6.

FIGS. 6, 7 and 8 are referenced next to describe another electronic apparatus 1 characterized as comprising a ceramic material and being provided with a surface mounting device embodying this invention. More particularly, this apparatus 1 comprises a planar PTC element 2 having a pair of electrodes on its upper and lower surfaces, a case 3 which contains the PTC element 2, a first contact terminal member 4 (also referred to as "the first member") buried inside a lower part of the case 3 and a second contact terminal member 5 (also referred to as "the second member") attached to the top surface of the case 3. The PTC element 2 comprises, as shown in FIG. 7, a disc 21 of thickness 2–3 mm and diameter 6–10 mm made of a barium titanate semiconductive ceramic material, having nickel electrodes 22 on its upper and lower surfaces, and a pair of circular silver electrodes 23 and 24 with diameter slightly smaller than the diameter of the nickel electrodes 22 is sintered onto these nickel electrodes 22. The invention, however, does not require the silver electrodes 23 and 24 to be circular. They may be elliptical, rectangular, polygonal, or of any reasonable shape.

Figure 9:
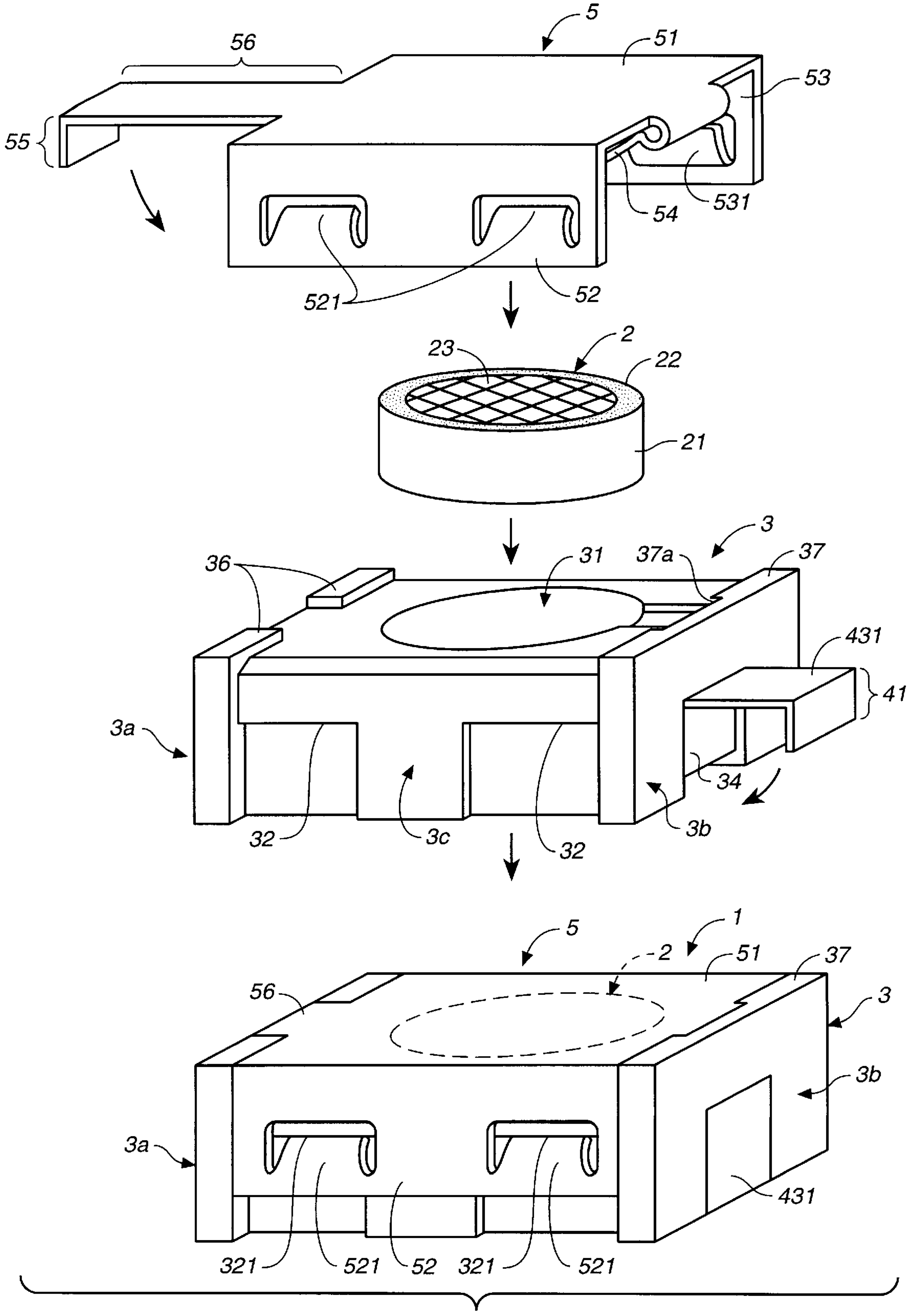
FIG. 9 is a diagonal view showing a process of assembling the electronic apparatus of FIG. 6.

The case 3 is in the shape of a rectangular box, made of a heat-resistant and electrically insulating resin material such as polyphenylene sulfide (PPS) or a liquid crystal polymer (LCP). A cylindrically shaped space 31 for containing the PTC element 2 therein is formed inside the case 3, as shown in FIG. 6, with a diameter slightly greater than that of the PTC element 2. As shown in FIGS. 7 and 8, an elastic compression contact part 42 of the first contact terminal member 4 protrudes upward into this inner space 31 from below. Two mutually opposite side walls 3*c* and 3*d* are provided with outwardly protruding steps 32 and 33, respectively. The second contact terminal member 5, attached to the top surface of the case 3, are provided with inwardly protruding engagement means 521 and 531 on its side edge parts 52 and 53, respectively, for engaging with the steps 32 and 33. As shown in FIGS. 6 and 9, the other pair of mutually opposite side walls 3*a* and 3*b* of the case 3 each has a groove 35 or 34 formed at a center part.

The second contact terminal member 5 has a planar part 51 (also referred to as "the top part") as shown in FIGS. 7 and 9 . In order to limit the motion of this planar part 51 of the second contact terminal member 5, when it is placed on top of the case 3, there are motion-limiting members 36 and 37 provided on the upper surface of the case 3. One of these motion-limiting members (36) is provided in the form of upward protrusions on the upper surface of the case 3 where it is not covered by the planar part 51, with the height about equal to or slightly greater than this planar part 51. The other motion-limiting member 37 has a groove 37*a* for having this planar part 51 inserted therein. As the second contact terminal member 5 is placed on top of the case 3, side edges of its planar part 51 fit the motion-limiting members 36 and 37 such that it is prevented from moving in the direction of these edges. It now goes without saying that different means for preventing the motion of the planar part 51 with respect to the case 3 may be employed. For example, throughholes may be formed at suitable places through the planar part 51 with protrusions formed on the upper surface of the case 3 corresponding to these throughholes for these protrusions to be inserted thereinto as the planar part 51 is placed on top of the case 3. This method is advantageous in that the motion of the planar part 51 in the longitudinal direction as well as in the transverse direction can be limited and the strength of attachment of the terminal member 5 to the case 3 is improved.

Figure 10:
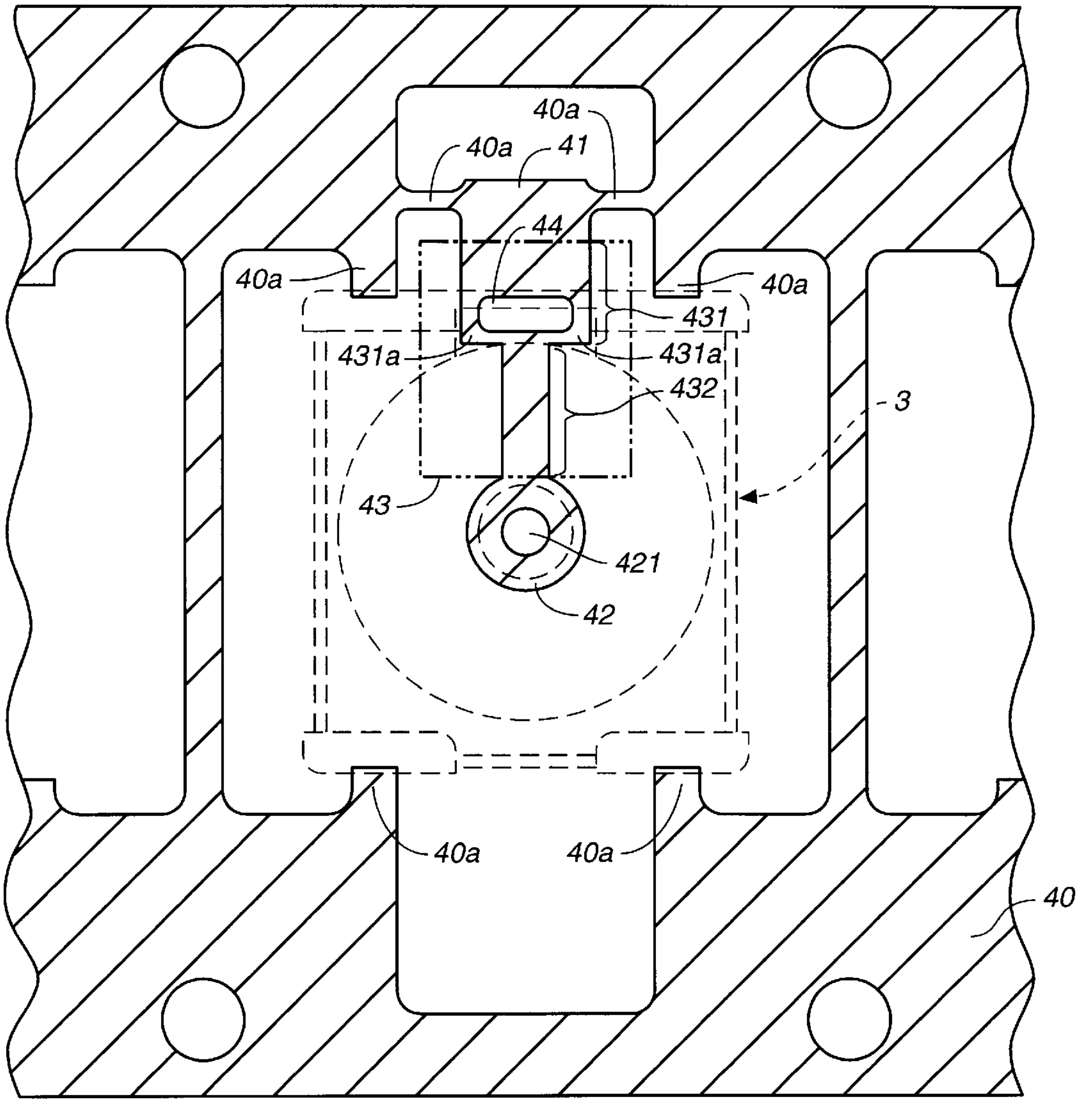
FIG. 10 is a plan view of a hoop material from which the first lead terminal member of FIG. 7 is produced.

The first contact terminal member 4 is made of an electrically conductive material, comprising an elastic metallic piece such as phosphor bronze, nickel silver or iron with its surfaces plated with tin, silver or the like and is made by bending it into a desired shape, having, as shown in FIG. 10 as well as FIG. 7, a connector terminal part 41 (also referred to as "the first connector part") and a circular compression contact part 42 (also referred to as "the first compression contact part ")at opposite ends and a lead line part 43 therebetween. The connector terminal part 41 is for connection to an electrode on the printed circuit board to which the apparatus 1 is to be mounted. The compression contact part 42 is for making a contact with the lower-surface electrode 24 of the PTC element 2. The lead line part 43 serves not only to electrically connect the aforementioned connector terminal and compression contact parts 41 and 42 but also as means for radiating off the heat generated by the PTC element 2. As shown in FIG. 10, the lead line part 43 has a wider part 431 and a narrower part 432. The connector terminal part 41 is formed by bending a tip portion of the wider part 431, and the narrower part 432 extends to the compression contact part 42.

The reason for providing the lead line part 43 with a wider part and a narrower part is to more effectively radiate the heat generated by the PTC element 2. In order to reduce the conduction of the generated heat to the connector terminal part 41, the lead line part 43 is made as much longer as possible than the shortest distance by which the positions of the connector terminal and compression contact parts 41 and 42 on the case 3 can be connected. As can be seen in FIG. 7, the wider and narrower parts 431 and 432 are bent such that a round-about route is formed between the connector terminal and compression contact parts 41 and 42. Described more in detail, the narrower part 432 extends towards the side wall 3b from the compression contact part 42 at a center part of the case 3, makes a 90-degree turn upward before reaching the outer surface to reach its highest point where it is bent again by 90 degrees outward and reaches the outer surface of the side wall 3*b*. The portion of the wider part 431 on the outer surface of the side wall 3*b* will be referred to as "the right-hand side part" and the remaining portion of the wider part 431 and the narrower part 432 which penetrate through and are buried inside the material of the case 3 are together referred to as "the buried part". The first lead terminal member 4 is then bent downward, as it is exposed to the exterior, along the outer surface of the side wall 3*b* inside the vertically formed groove 34 thereon, reaching the bottom surface 3*e* of the case 3. For this reason, the depth of the aforementioned groove 34 is approximately the same as or greater than the thickness of the wider part 431 so as to prevent it from protruding outward from the outer surface of the side wall 3*b*. As shown in FIG. 10, an elliptical hole 44 is formed through the wider part 431 where it connects to the narrower part 432 to form a narrow-path region 431*a* and to thereby reduce heat conduction therethrough. In summary, since the lead line part 43 is stretched from the compression contact part 42 to the bottom surface 3*e* by making a large upward detour and since a narrow-path region 431*a* is provided in the wider part 431, the conduction route of heat from the PTC element 2 to the connector terminal part 41 is made as long as practically possible so as to reduce the amount of heat traveling therethrough.

The compression contact part 42 has a circular upward protrusion 421 formed in the middle for making a point contact with the lower-surface electrode 24 of the PTC element 2 such that the heat conduction through this contact to the first lead terminal member 4 will be reduced. It now goes without saying that the protrusion 421 need not be circular in shape but may assume any other reasonable shape such as an ellipse or a rectangle. As another alternative, two or more protrusions may be provided to the compression contact part 42 for making several point contacts with the lower-surface electrode 24, or use may be made of no protrusions to establish a surface contact between the compression contact part 42 and the lower-surface electrode 24 of the PTC element 2. In view of the stability of the PTC element 2 and the contact between the compression contact part 42 and the lower-surface electrode 24, three is the preferred number of protrusions to be provided.

The connector terminal part 41 is generally in the shape of a rectangle as shown in FIG. 10, formed by bending an end portion of the wider part 431 as shown in FIG. 7. Its shape, however, is not limited to be rectangular but may be circular or elliptical. In summary, the first contact terminal member 4 is set by positioning its connector terminal part 41 at a specified end portion of the bottom surface 3*e* of the case 3 and burying the narrow-path region 431*a* of the wider part 431 and the narrower part 432 in the side wall 3*b* so as to be integral with the case 3.

The second contact terminal member 5 is made of an electrically conductive material, comprising a flexible metallic piece such as phosphor bronze, nickel silver, a Cu—Ti alloy or stainless steel with its surfaces plated with tin, silver or the like and is made by bending it into a desired shape, including, as shown in FIG. 7, the planar part 51 for covering the upper surface of the case 3, the side edge parts 52 and 53 for covering portions of the side walls 3*c* and 3*d* of the case 3, a compression contact part 54 (also referred to as "the second compression contact part ") for pressing down the electrode 23 on the upper surface of the PTC element 2, a connector terminal part 55 (also referred to as "the second connector part") for surface mounting, and a lead line part 56 (also referred to as "the left-hand side part") which is elongated like a band to connect the connector terminal part 55 to the upper surface of the case 3. As explained above, the inwardly protruding engagement means 521 and 531 are provided on the side edge parts 52 and 53, respectively, for engaging with the steps 32 and 33 and thereby preventing the second contact terminal member 5 from disengaging from the case 3.

The compression contact part 54 is formed by bending a protruding piece extending from the planar part 51, as shown in FIGS. 6 and 7, downward in a hairpin style such that the free edge of this extending piece will be positioned below a center region of the planar part 51, as shown in FIG. 7. This free edge is slightly bent upward so as to provide a downwardly convex surface by which the upper-surface electrode 23 of the PTC element 2 is pressed downward. Because of this hair-pin style bending, the second contact terminal member 5 functions as a spring such that the reaction to the force of the PTC element 2 to the compression contact part 54 is absorbed and deformation and breakage of the material are prevented. With the hair-pin curvature formed as shown in FIG. 7, the force applied to this bending portion of the second contact terminal member 5 tends to push the compression contact part 54 towards the upper surface of the case 3. This has the favorable effect of keeping the second contact terminal member 5 attached to the case 3.

Figure 11:
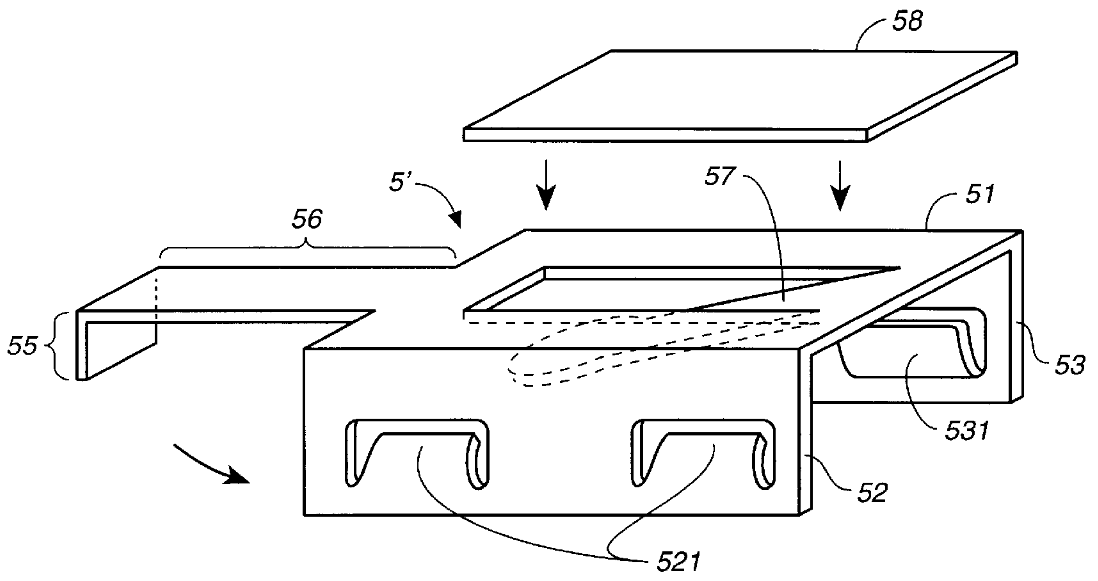
FIG. 11 is a diagonal view of another second lead terminal member embodying the invention.

FIG. 11 shows another terminal member 5' which can replace the second contact terminal member 5 described above as incorporated in the apparatus 1. Parts of this member 5' which are comparable or function equivalently to those of the member 5 described above are indicated by the same numeral for convenience. The member 5' is characterized as having a portion of its planar part 51 cut out to form a compression contact part 57 which is bent downward and including a sealing member 58 attached to the planar part 51 to close the hole created by the compression contact part 57.

The lead line part 56 (whether as a portion of the alternative member 5' shown in FIG. 11 or the second contact terminal member 5 shown in FIGS. 6–10) comprises an elongated piece extending from one edge 51*a* of the planar part 51 and is bent downward into the groove 35 formed at the center of the side wall 3*a*. Its free edge part is bent along the bottom surface 3*e* of the case 3 to serve as the connector terminal part 55.

FIG. 9 shows an assembly process for the electronic apparatus 1. The PTC element 2 is placed from above into the space 31 inside the case 3, into the walls of which the first lead terminal member 4 is already partially buried, and the second lead terminal member 5 is placed over it such that its planar part 51 and the side edge parts 52 and 53 will cover the upper and side surfaces of the case 3. For the convenience of the assembly work, the wider part 431 of the first lead terminal member 4 is extended perpendicularly from the side wall 3*b* of the case 3. Similarly, the lead line part 56 of the second lead terminal member 5 is originally coplanar with the planar part 51 and extended perpendicularly to the side wall 3*a* of the case 3.

The case 3, into which the first lead terminal member 4 is partially buried, is produced in a plurality of units by punching a belt-like elongated hoop member 40 into a desired shape having a plurality of first lead terminal members 4 connected in a single line as shown in FIG. 10. Each first lead terminal member 4 is placed inside a mold for corresponding one of the cases 3 and a resin material is injected into the molds to uni-structurally form the cases 3. Individual cases 3 are produced thereafter by removing connecting parts 40*a* of the hoop member 40.

When the second lead terminal member 5 is placed over the case 3, as shown in FIG. 9, the compression contact part 54 of the second lead terminal member 5 compresses the upper-surface electrode 23 of the PTC element 2, and the compression contact part 42 of the first lead terminal member 4 compresses the lower-surface electrode 24 of the PTC element 2, thereby holding the PTC element 2 securely inside the internal space 31 of the case 3. At the same time, the engagement means 521 and 531 formed on the side edge plates 52 and 53 slide downward along the side walls 3*c* and 3*d* until they engage with the steps 32 and 33 to be locked. In this manner, the second lead terminal member 5 is prevented from moving upward and sandwiched condition of the PTC element 2 between the compression contact parts 42 and 54 is maintained.

The wider part 431 protruding from the side surface 3b of the case 3 and the lead line part 56 extending from the planar part 51 of the second lead terminal member 5 are extended such that the connector terminal part 41 of the first lead terminal member 4 and the connector terminal part 55 of the second lead terminal member 5 are on the bottom surface 3*e* of the case 3.

Thus, the PTC element 2 is placed inside a container comprising the case 3 and the second lead terminal member 5 and is ready for surface mounting. Since the electronic apparatus 1 for surface mounting is produced merely by assembling the PTC element 2, the first and second lead terminal members 4 and 5 and the case 3 which are all independently and preliminary produced, the production process is much simplified. Although the invention was described above with reference to a PTC element, it now goes without saying that apparatus containing other kinds of electronic elements such as an NTC element and a piezoelectric element having electrodes on its upper and lower surfaces can be similarly produced according to this invention. The invention, however, is particularly effective for PTC and NTC elements for current control which tend to produce heat at the time of operation.

A surface mounting device according to this invention, as described above, makes the surface mounting of an electronic apparatus easy. Since the electrodes of the element are not directly connected to the circuit board, the heat at the time of soldering does not damage the ceramic material of the element or its electrodes. If one or more protrusions are provided on the compression contact part of the first lead terminal member, the transfer of heat generated by the electronic element itself to the circuit board is limited such that the ill-effects of such heat on other electronic components placed near by can be reduced. The engaging means on the side walls of the case make the assembly of the apparatus easier. Since the second lead terminal member includes a 180-degree bending, forces applied from the element are absorbed thereby and deformation and breakage of the member can be prevented.

What is claimed is:

1. A surface-mounting device for an electronic element having an upper-surface electrode and a lower-surface electrode formed on upper and lower main surfaces thereof, said device comprising:

said electronic element;

an electrically insulative case having a top surface with an opening and enclosing an empty space surrounded by side walls and a bottom member with a bottom surface, said case enclosing said electronic element in said empty space such that said upper-surface electrode is below said top surface and said lower-surface electrode is above and facing said bottom member;

a first member which is an elongated single electrically conductive member and includes a first compression contact part elastically pressing said lower-surface electrode on said electronic element, a buried part which penetrates through and is buried inside one of said side walls and said bottom member of said case, a right-hand side part disposed externally on one of said side walls of said case, and a first connector part on said bottom surface of said bottom member, said buried part being between said first compression contact part and said right-hand side part, said right-hand part being between said first connector part and said buried part; and a second member which is another elongated single electrically conductive member and includes a second compression contact part, a top part covering said opening in said top surface of said case, a left-hand side part disposed externally on another of said side walls of said case, and a second connector part on said bottom surface of said case, said second member being bent substantially by 180 degrees between said second compression contact part and said top part, said top part extending between said second compression part and said left-hand side part, said left-hand side part extending between said top part and said second connector part.

2. The surface-mounting device of claim 1 wherein said first compression contact part has at least one protrusion formed thereon for pressing said lower-surface electrode.

3. The surface-mounting device of claim 1 wherein said case has mutually opposite side walls having engaging mechanisms thereon, said second member having vertically extending parts which cover at least a portion of said side walls and engage with said engaging mechanisms.

4. The surface-mounting device of claim 2 wherein said case has mutually opposite side walls having engaging mechanisms thereon, said second member having vertically extending parts which cover at least a portion of said side walls and engage with said engaging mechanisms.

5. The surface-mounting device of claim 3 wherein said case comprises means for preventing motion of said top part with respect thereto.

6. The surface-mounting device of claim 4 wherein said case comprises means for preventing motion of said top part with respect thereto.

* * * * *